US007611585B2

(12) United States Patent
Choi

(10) Patent No.: US 7,611,585 B2
(45) Date of Patent: Nov. 3, 2009

(54) PLASMA REACTION CHAMBER WITH A BUILT-IN MAGNETIC CORE

(75) Inventor: Dae-Kyu Choi, Suwon-si (KR)

(73) Assignee: New Power Plasma Co., Ltd. (KR)

( * ) Notice: Subject to any disclaimer, the term of this patent is extended or adjusted under 35 U.S.C. 154(b) by 424 days.

(21) Appl. No.: 10/992,475

(22) Filed: Nov. 19, 2004

(65) Prior Publication Data

US 2006/0090701 A1　May 4, 2006

(30) Foreign Application Priority Data

Nov. 3, 2004　(KR) ...................... 10-2004-0088816

(51) Int. Cl.
*C23C 16/00* (2006.01)
*H01L 21/306* (2006.01)
*C23F 1/00* (2006.01)

(52) U.S. Cl. ............... 118/719; 118/723 R; 118/723 E; 156/345.31; 156/345.32; 156/345.43; 156/345.44; 156/345.45

(58) Field of Classification Search ................. 156/345.31–345.32, 345.45, 345.47; 118/719, 118/723 I, 723 IR, 723 E; 204/298.25, 298.26
See application file for complete search history.

(56) References Cited

U.S. PATENT DOCUMENTS

| | | | | |
|---|---|---|---|---|
| 5,575,855 A | * | 11/1996 | Kanai et al. ................. | 118/718 |
| 6,132,517 A | * | 10/2000 | Sivaramakrishnan et al. .......................... | 118/719 |
| 6,375,860 B1 | * | 4/2002 | Ohkawa et al. ............... | 216/71 |
| 6,380,684 B1 | * | 4/2002 | Li et al. ................. | 315/111.21 |
| 6,435,428 B2 | * | 8/2002 | Kim et al. .................... | 239/553 |
| 6,523,493 B1 | * | 2/2003 | Brcka ....................... | 118/723 I |
| 6,635,115 B1 | * | 10/2003 | Fairbairn et al. ............ | 118/719 |
| 2002/0101167 A1 | * | 8/2002 | Shan et al. ............. | 315/111.11 |
| 2002/0152960 A1 | * | 10/2002 | Tanaka et al. ........... | 118/723 R |

* cited by examiner

*Primary Examiner*—Karla Moore
(74) *Attorney, Agent, or Firm*—NSIP Law

(57) ABSTRACT

A plasma reaction chamber includes a chamber housing having two inner connection passages for connecting two vacuum chambers to other vacuum chambers. Two vacuum chambers and two inner connection passages form a continuous discharge path. At least one magnetic core is mounted in two vacuum chambers or two inner connection passages, and a coil connected to a power source is wounded around the magnetic core so as to transfer induced electromotive force to the continuous discharge path. The plasma reaction chamber is configured so that at least two vacuum chambers are integrated in a multiple arrangement, and common parts are shared in common, so that at least two substrates may be treated in parallel at the same time, thereby improving productivity per unit area and making it possible to construct a low-cost and high-efficient substrate treatment system.

22 Claims, 16 Drawing Sheets

PLASMA REACTION CHAMBER WITH A BUILT-IN MAGNETIC CORE

CLAIM OF PRIORITY

This application makes reference to, incorporates the same herein, and claims all benefits accruing under 35 U.S.C. §119 from an application entitled PLASMA REACTION CHAMBER WITH A BUILT-INMAGNETIC CORE filed with the Korean Intellectual Property Office on 3 Nov. 2004, and there duly assigned Serial No. 2004-88816.

BACKGROUND OF THE INVENTION

1. Field of the Invention

The present invention relates to a plasma reaction chamber, and particularly to a plasma reaction chamber having at least two vacuum chambers integrated and disposed in a multiple arrangement so as to treat at least two substrates in parallel. More particularly, the present invention relates to a plasma reaction chamber having a magnetic core built into the plasma reaction chamber so as to generate plasma and provide it to at least two vacuum chambers at the same time.

2. Description of the Prior Art

As in other industries, various endeavors to improve productivity in the semiconductor field for manufacturing a semiconductor integrated circuit or a liquid crystal device are continuing. To improve productivity, a basic requirement is enlargement or improvement of production facilities. However, increasing the production facilities causes increased cost not only for extension of factory installations but also for space for additional facilities such as a clean room, thereby increasing the expense for the consumer. In particular, in the semiconductor manufacturing process, the productivity per unit area is one of the important factors that affect the price of the final product. Thus, the components of the production facility should be arranged in an effective manner in order to increase the productivity per unit area.

A cluster system is configured so that a plurality of process chambers are positioned around one transfer chamber. The cluster system is known to be effective in improving productivity since many processes are conducted in a bundle. In order to increase productivity per unit area, there is also provided a substrate treatment system in which plasma reaction chambers are laminated to minimize the bottom area. As mentioned above, a plurality of plasma reaction chambers are laminated or arranged in parallel, as in a cluster type arrangement, to increase productivity per unit area.

However, since each plasma reaction chamber has an independent configuration, decrease in facility components of the plasma reaction chamber and reduction in costs might be not so effective. If common parts, such as a utility line, are configured in common when two or more plasma reaction chambers are vertically or horizontally arranged in parallel, it will be possible to obtain cost reduction and decrease in facility components, in addition to reduction in space.

SUMMARY OF THE INVENTION

The present invention is designed to solve the problems of the prior art, and therefore it is an object of the present invention to provide a plasma reaction chamber in which at least two vacuum chambers are integrated in a multiple arrangement, and common parts are used in common, so as to treat at least two substrates in parallel, thereby improving productivity per unit area.

In order to accomplish the above object, the present invention provides a plasma reaction chamber, which includes a chamber housing having at least two vacuum chambers and at least two inner connection passages for connecting the vacuum chambers; at least one magnetic core installed in the chamber housing to transfer induced electromotive force to a continuous discharge path formed by two vacuum chambers and two inner connection passages, the magnetic core having coils connected to a power source and supplying electromotive force for plasma excitation to the discharge path; and a gas input port installed in the chamber housing for inputting gas into the vacuum chamber, and a gas output port installed in the chamber housing for outputting gas from the vacuum chamber.

Preferably, the magnetic core(s) has (have) a ring shape mounted on an inner surface of the vacuum chamber.

Preferably, the magnetic core(s) has (have) a ring shape mounted on an inner side of the inner connection passage.

The plasma reaction chamber of the present invention may further include a dielectric plate installed to cover a surface of the magnetic core oriented to the discharge path.

Preferably, the vacuum chambers are vertically laminated or horizontally arranged in parallel.

Preferably, the vacuum chambers include a susceptor installed in a lower portion for putting thereon a substrate to be treated, and a baffle plate installed in an upper portion.

Preferably, the vacuum chambers have respective slit valves for loading/unloading a substrate to be treated.

Preferably, the coils wound around the magnetic core are connected to the power source by means of series connection, parallel connection, or a combination thereof.

Preferably, the vacuum chambers include: a first planar electrode pair installed on upper and lower surfaces of the vacuum chamber, and a second planar electrode pair installed on both sidewalls in the vacuum chamber; a first power source for supplying power of a first frequency to the first planar electrode pair; a second power source for supplying power of a second frequency to the second planar electrode pair; and a phase/voltage controller for adjusting the phase difference and/or voltage level of the first and second frequencies by control of the first and second power sources.

Preferably, the gas input port includes a gas input port housing having a gas input hole formed out of the chamber housing and a plurality of discharge holes formed into the chamber housing; and at least one gas separator installed in the gas input port housing to partition an interior of the gas input port housing between the gas input hole and the discharge holes, the gas separator(s) having a plurality of holes so that the gas input through the gas input hole is uniformly distributed and then outputted through the discharge holes.

At this point, the gas input port preferably has at least two gas input holes arranged in parallel.

Preferably, the gas output port includes: a gas output port housing having a plurality of inhaling holes extending into the chamber housing and a gas output hole extending out of the chamber housing; and at least one gas separator installed in the gas output port housing to partition an interior of the gas output port housing between the inhaling holes and the gas output hole, the gas separator(s) having a plurality of holes so that the gas input through the inhaling holes is uniformly inhaled and then output through the discharge hole.

At this point, the gas out port preferably has at least two gas output holes arranged in parallel.

Preferably, at least two gas input ports or at least two gas output ports are provided in the chamber housing so that the chamber housing has a multiple gas input or output structure.

In another aspect of the invention, there is also provided a substrate treatment system which includes at least one load port for loading a cassette on which a substrate to be treated is loaded; a transfer chamber connected to the load port and having a transfer robot for carrying a substrate; a cooling stage connected to the transfer chamber for cooling a substrate; and a plasma reaction chamber connected to the transfer chamber and having a magnetic core built therein, wherein the plasma reaction chamber includes a chamber housing having at least two inner connection passages for connecting at least two vacuum chambers to at least two vacuum chambers; at least one magnetic core installed in the chamber housing to transfer induced electromotive force to a continuous discharge path formed through two vacuum chambers and two inner connection passages, the magnetic core having coils connected to a power source and supplying electromotive force for plasma excitation to the discharge path; and a gas input port installed to the chamber housing for inputting gas into the vacuum chamber and a gas output port installed in the chamber housing for outputting gas from the vacuum chamber.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
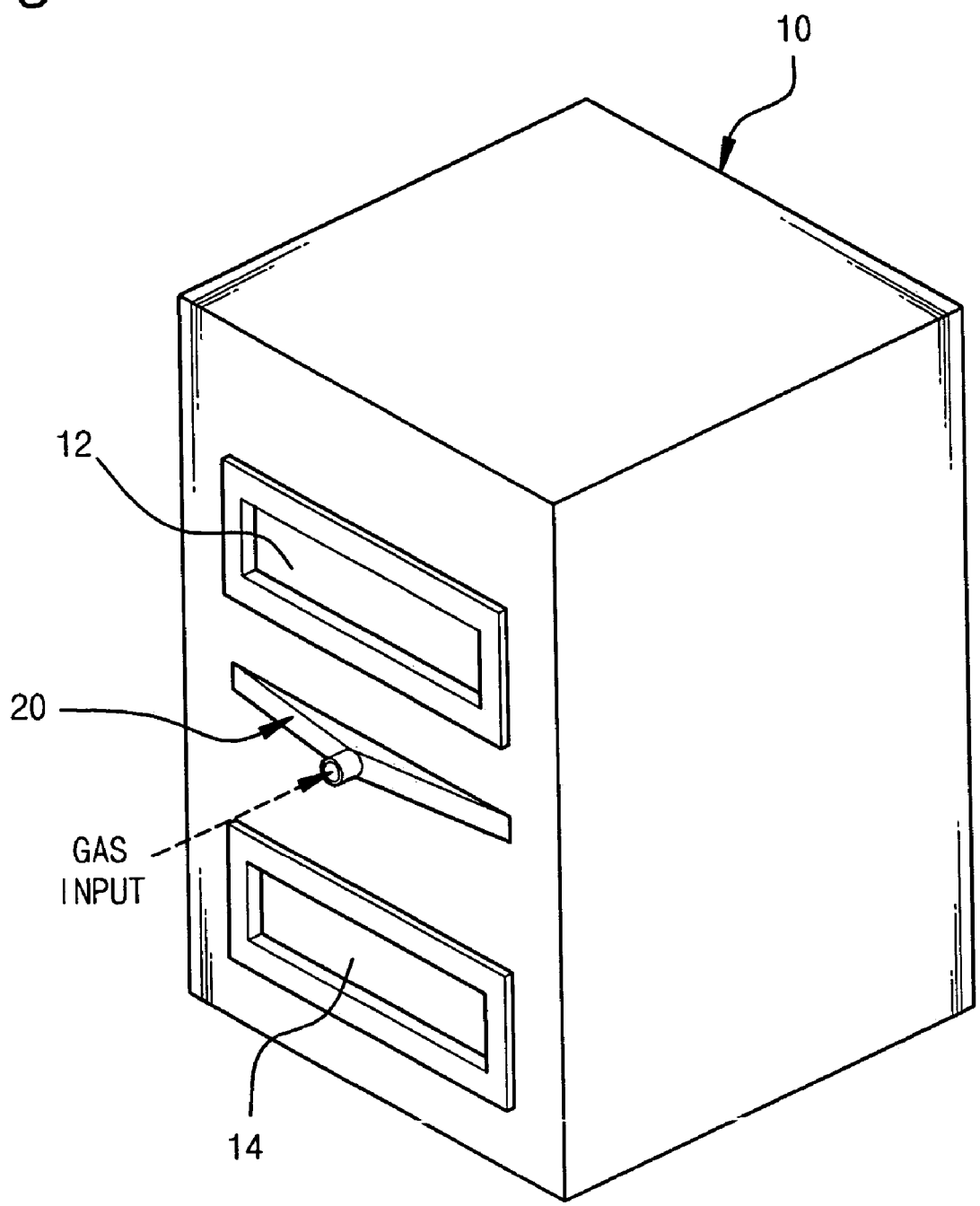
FIGS. 1 and 2 are perspective views showing the front and rear sides of a plasma reaction chamber according to a preferred embodiment of the present invention.

Hereinafter, a preferred embodiment of the present invention will be described in more detail referring to the drawings. The embodiment of the present invention may be modified in various ways, and the scope of the invention should be not interpreted as being limited in the following embodiment. The embodiment is proposed for a better understanding by those of ordinary skill in the art. Thus, in the drawings, the shape of each component may be exaggerated in order to emphasize its function for a clearer explanation.

Figure 2:
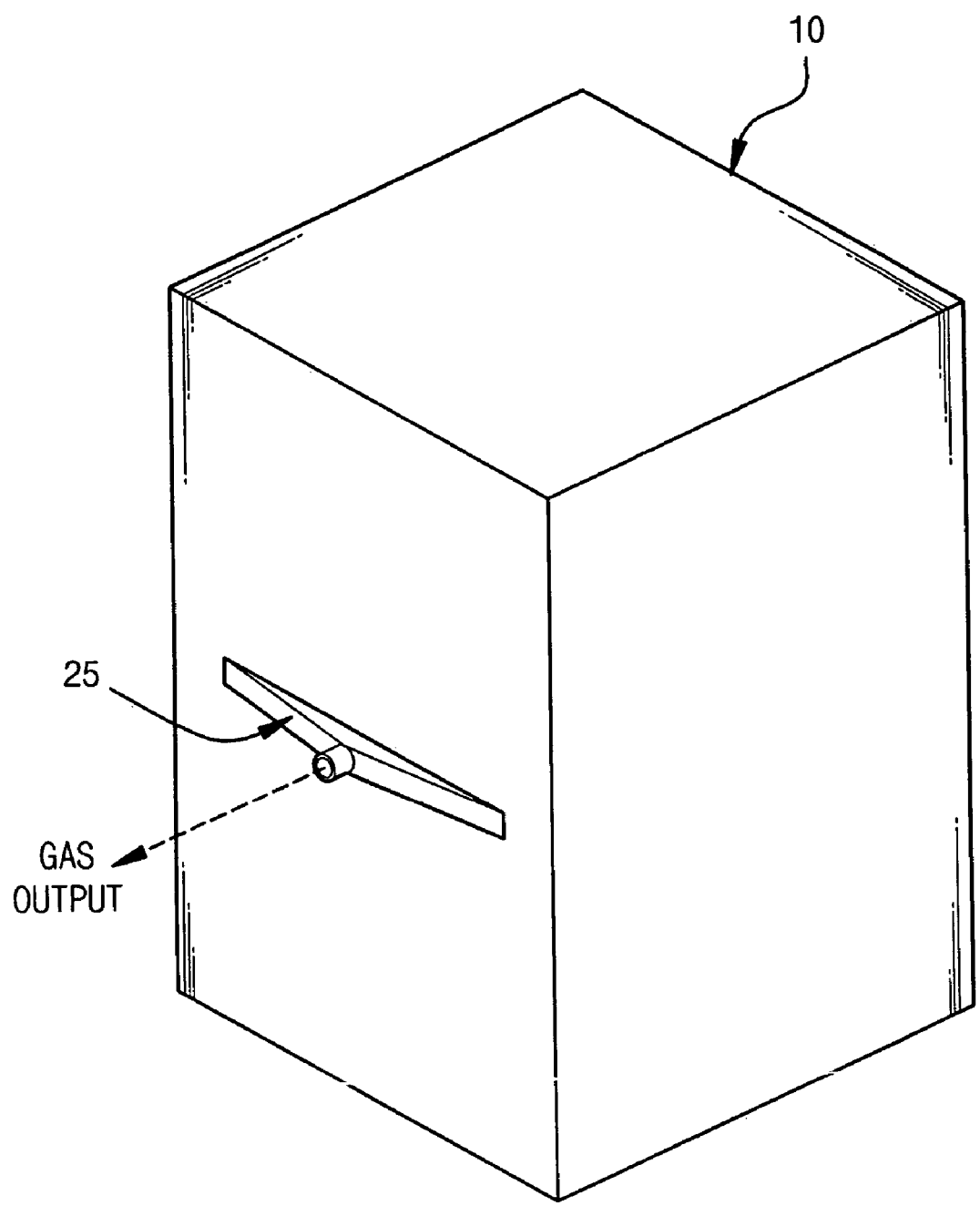

FIGS. 1 and 2 are perspective views showing front and rear sides of a plasma reaction chamber according to the preferred embodiment of the present invention.

Referring to FIGS. 1 and 2, the plasma reaction chamber according to this embodiment includes a chamber housing 10 configured so that two vacuum chambers are laminated vertically therein. Two slit valves 12 and 14 for loading or unloading a substrate to be treated in/from the vacuum chamber are arranged vertically on a front surface of the chamber housing 10. A gas input port 20 is installed between the slit valves 12 and 14, and a gas output port 25 is installed on a rear surface of the chamber housing 10.

Figure 3:
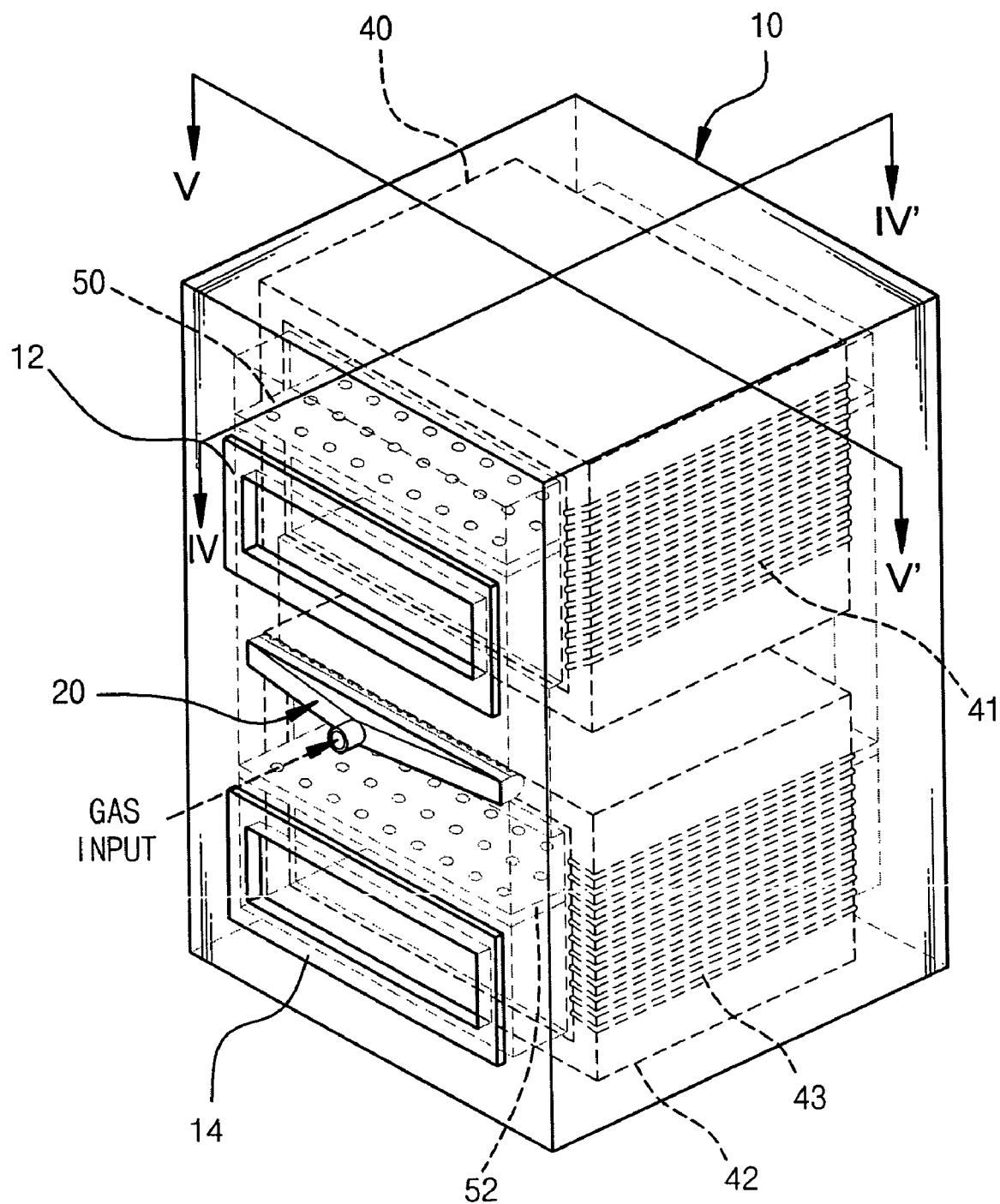
FIG. 3 shows an inner configuration of the plasma reaction chamber according to the present invention.
Figure 4:
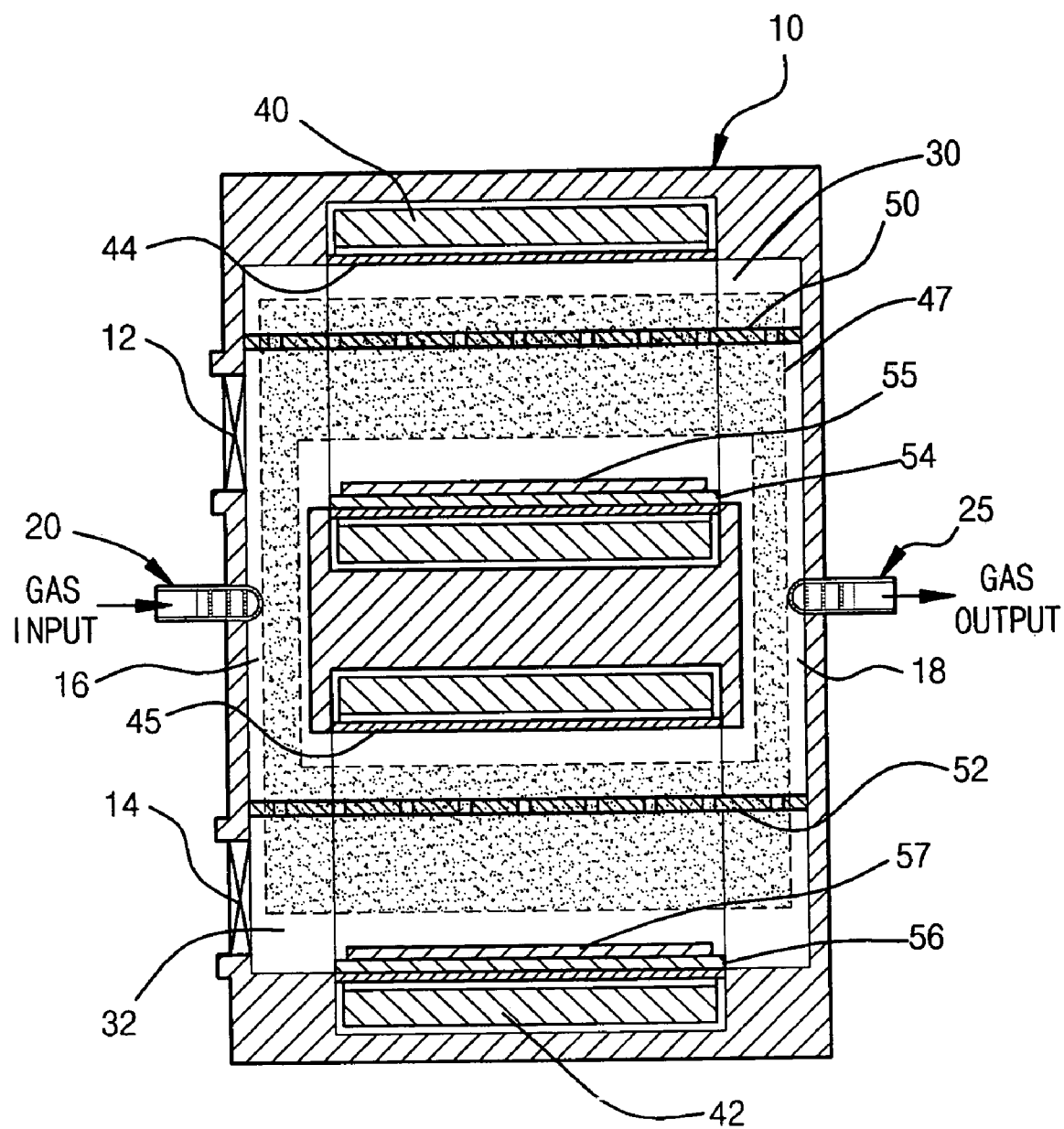
FIGS. 4 and 5 are sectional views showing the plasma reaction chamber of FIG. 3, taken along IV-IV' line and V-V' line of FIG. 3, respectively.
Figure 5:
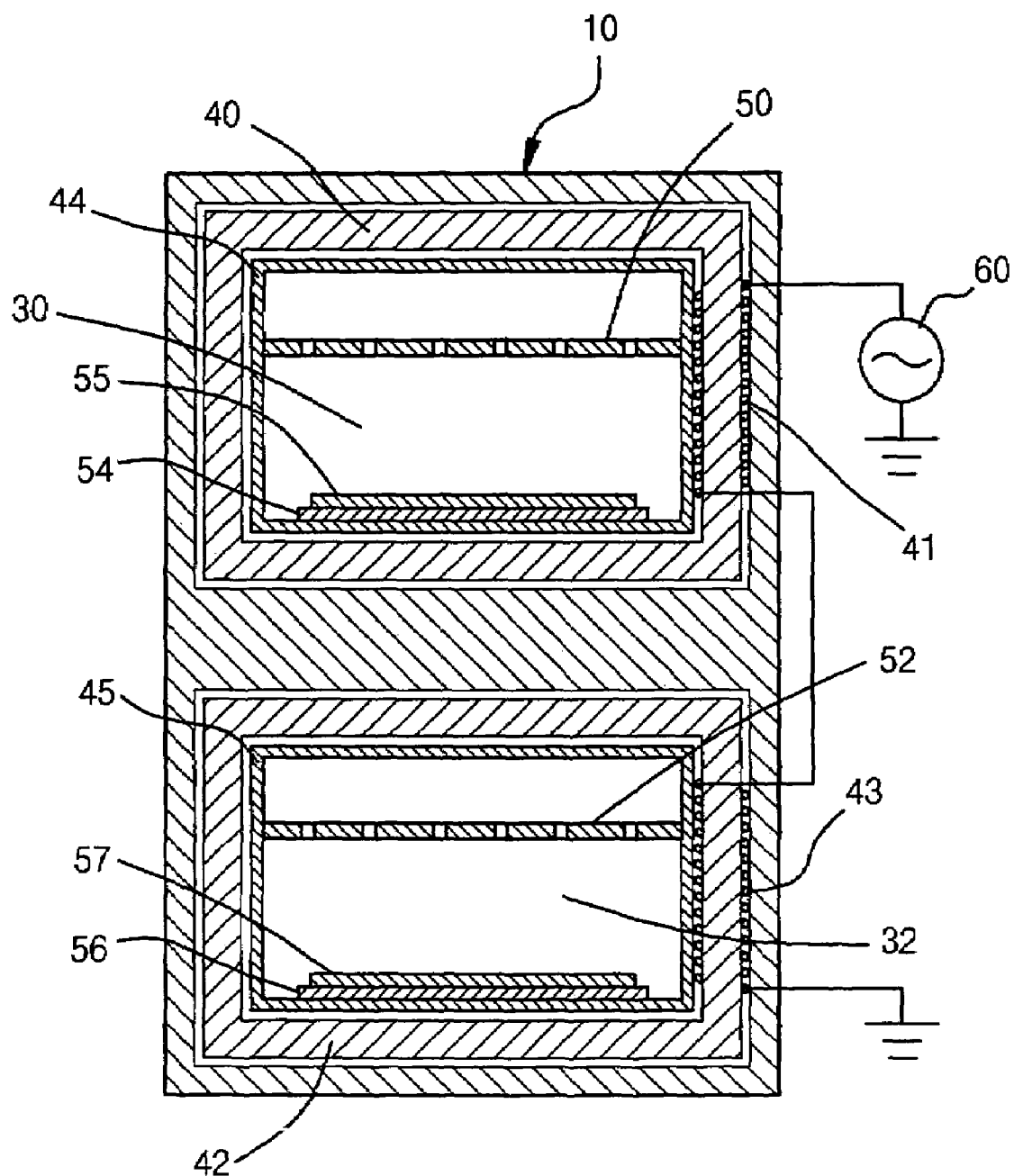

FIG. 3 shows an inner configuration of the plasma reaction chamber, and FIGS. 4 and 5 are sectional views taken along line IV-IV' and line V-V', respectively, of FIG. 3.

Referring to FIGS. 3 to 5, two vacuum chambers 30 and 32 are vertically laminated in the chamber housing 10. In the upper and lower chambers 30 and 32, respectively, a susceptor 54 and 56, respectively, for putting a substrate 55 and 57, respectively, to be treated is installed on a bottom, and a baffle plate 50 and 52, respectively, having a plurality of holes is installed in an upper portion.

The upper and lower chambers 30 and 32, respectively, are interconnected by means of two inner connection passages 16 and 18, respectively. The inner connection passages 16 and 18 are respectively formed toward the front and rear surfaces, respectively, of the chamber housing 10. As mentioned above, a continuous discharge path 47 composed of two vacuum chambers 30 and 32 and two inner connection passages 16 and 18 is formed in the chamber housing 10.

In the chamber housing 10, two magnetic cores 40 and 42 are installed in or built into the inner sides of the upper and lower chambers 30 and 32, respectively, so as to transfer induced electromotive force to the continuous discharge path 47. In addition, dielectric plates 44 and 45 are installed to cover surfaces of the magnetic cores 40 and 42, respectively, oriented toward the discharge path. Coils 41 and 43 are wound around magnetic cores 40 and 42, respectively, and the coils 41 and 43 are connected in series with a power source 60 that supplies RF power. If power is supplied to the coils 41 and 43, electromotive force for exciting plasma is supplied to the discharge path 47, thereby conducting plasma discharge.

Figure 6:
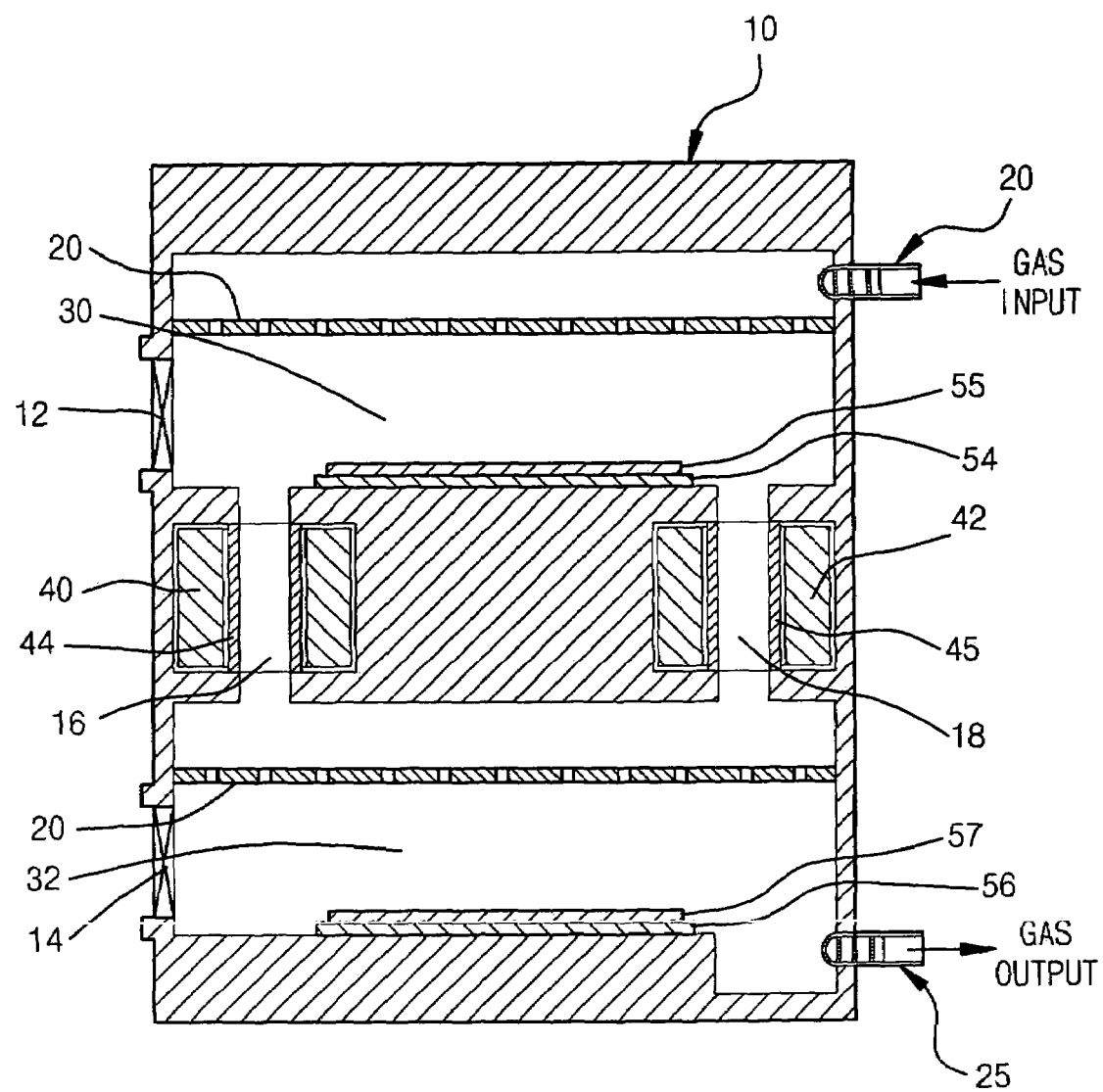
FIG. 6 is a sectional view showing that a magnetic core is mounted in an inner connection passage of the plasma reaction chamber.

As a modification, the magnetic cores 40 and 42 may by installed on the inner connection passages 16 and 18, respectively, as shown in FIG. 6. In another case, the magnetic cores 40 and 42 may be installed on the upper and lower chambers 30 and 32, respectively, and on the inner connection passages 16 and 18, respectively. Although it is described in this embodiment that two vacuum chambers 30 and 32 are vertically laminated, the vacuum chambers 30 and 32 may also be arranged horizontally and in parallel. In addition, the number of vacuum chambers that use discharge path 47 in common may be increased to three or more. A plurality of coils 41 and 43 wound around the magnetic cores 40 and 42, respectively, may be connected to the power source 60 by means of a series connection, a parallel connection, or a combination thereof.

Figure 7:
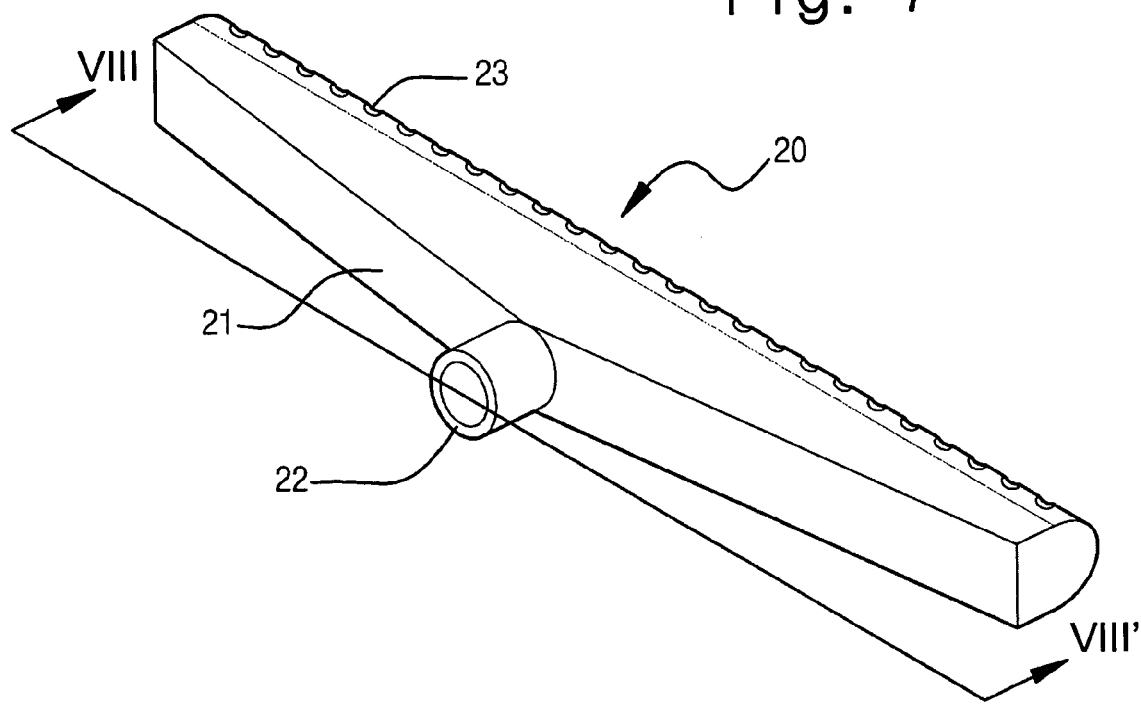
FIGS. 7 and 8 are a perspective view and a sectional view, respectively, of a gas input port.
Figure 8:
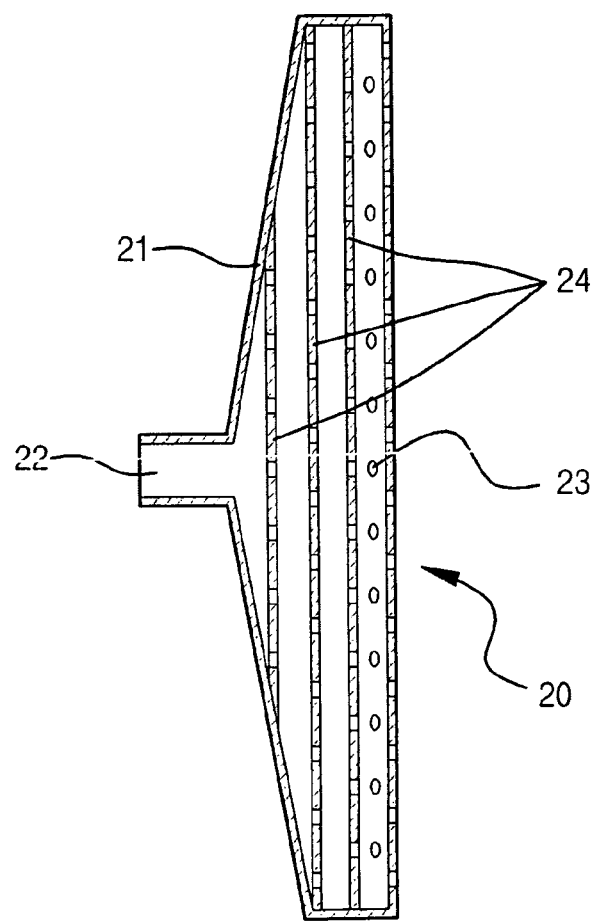

FIGS. 7 and 8 are a perspective view and a sectional view, respectively, of the gas input port.

Referring to FIGS. 7 and 8, the gas input port 20 includes a gas input port housing 21 which has a gas input hole 22 leading out of the chamber housing 10 and a plurality of discharge holes 23 leading into the chamber housing 10. The gas input port housing 21 has a hollow interior, and a plurality of gas separators 24 are installed in parallel in the interior of the gas input port housing 21 so as to partition the interior between the gas input hole 22 and the discharge holes 23. The gas separator 24 has a plurality of holes so that the gas inputted through the gas input hole 22 may be uniformly distributed, and then discharged through the plurality of discharge holes 23.

Figure 9:
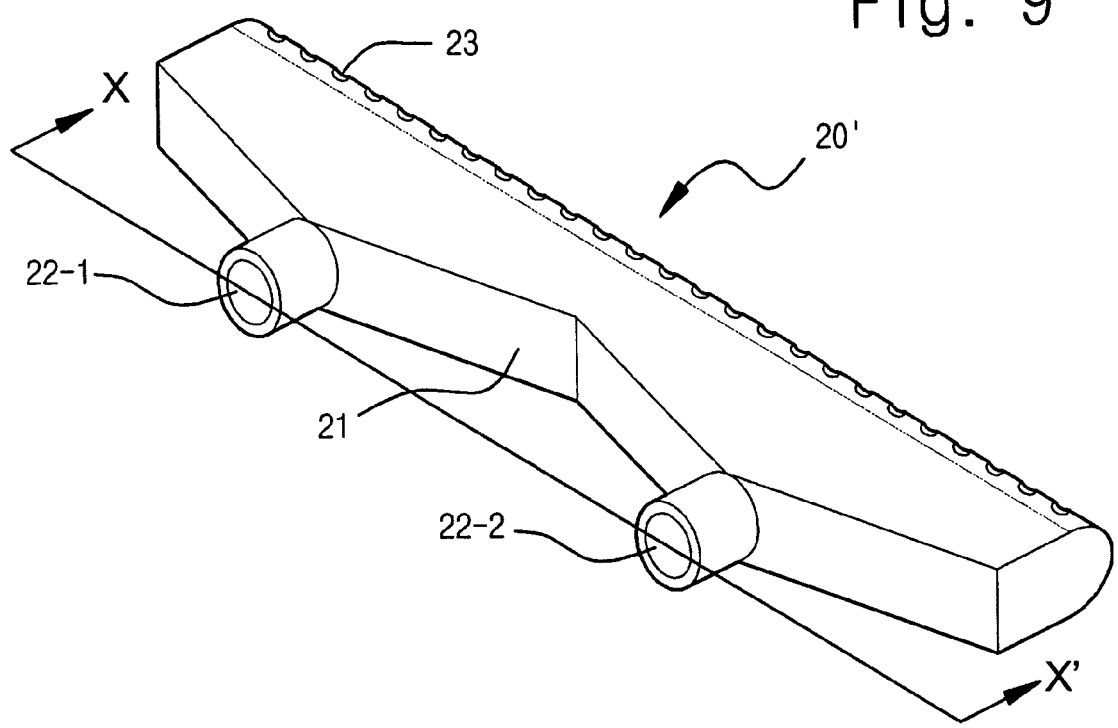
FIGS. 9 and 10 are a perspective view and a sectional view, respectively, of a gas input port, the entrance of which is modified to have a double structure.
Figure 10:
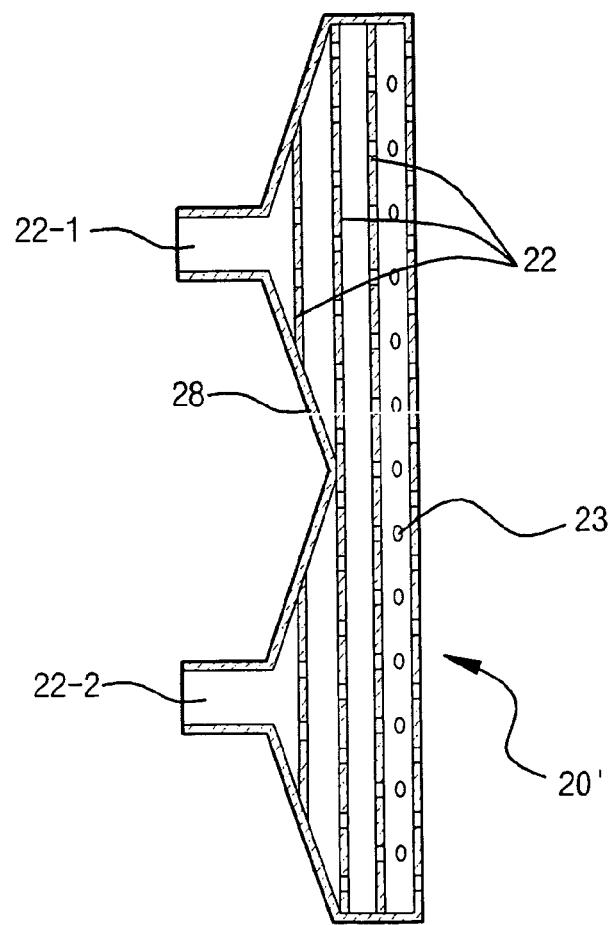

FIGS. 9 and 10 are a perspective view and a sectional view, respectively, of a gas input port having an input hole which is modified to have a double structure. Referring to FIGS. 9 and 10, the gas input port 20' is modified so that two or more gas input holes 22-1 and 22-2 are provided in parallel.

Figure 11:
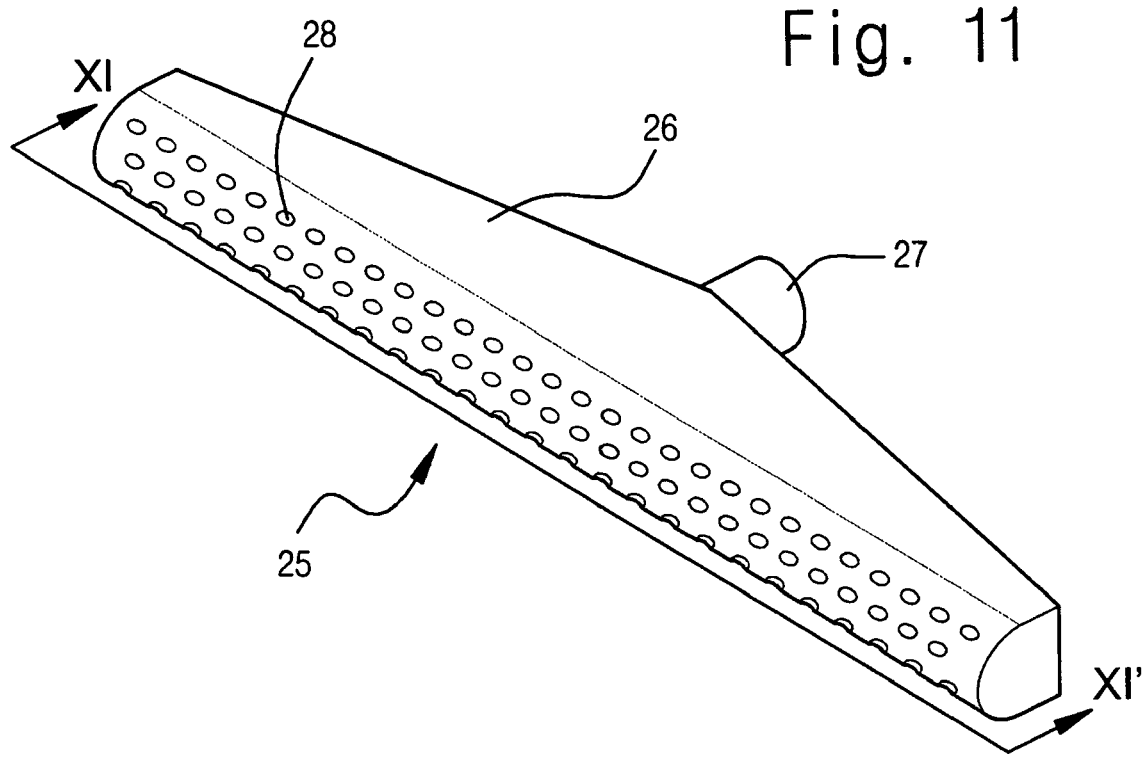
FIGS. 11 and 12 are a perspective view and a sectional view, respectively, of a gas output port.
Figure 12:
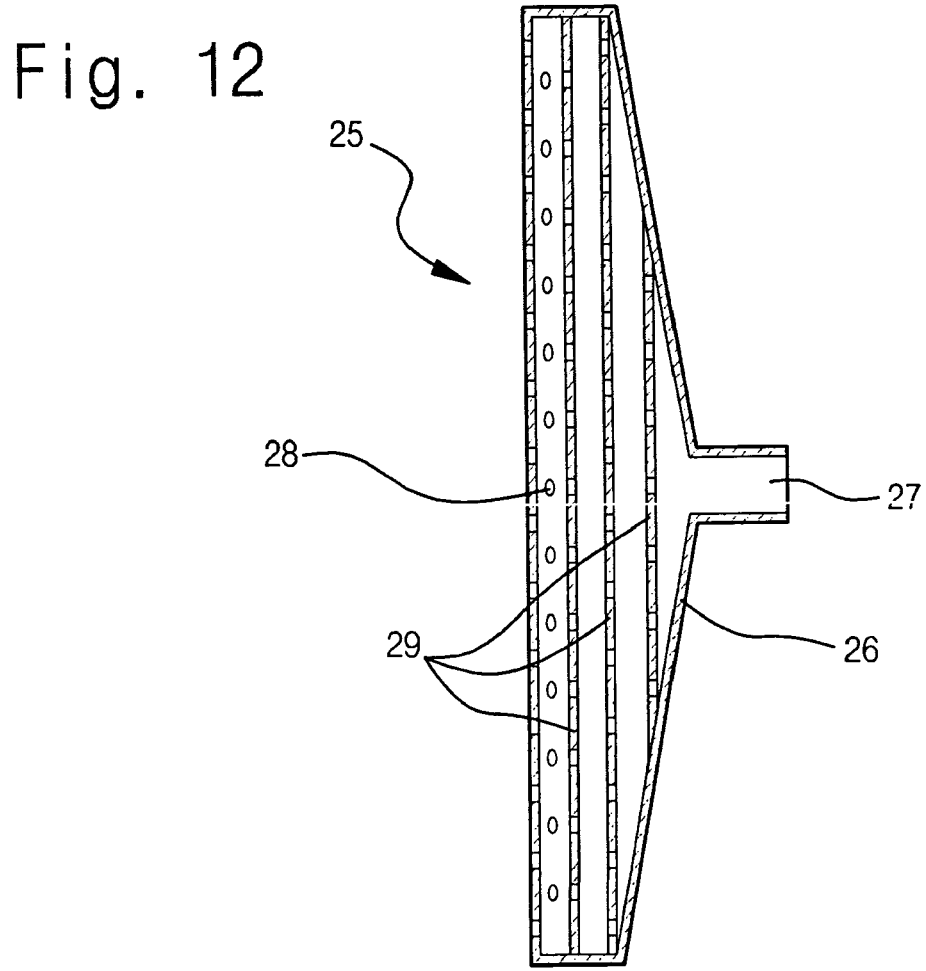

FIGS. 11 and 12 are a perspective view and a sectional view, respectively, of the gas output port.

Referring to FIGS. 11 and 12, the gas output port 25 includes a gas output port housing 26 having a plurality of inhaling holes 28 leading into the chamber housing 10 and a gas output hole 27 leading out of the chamber housing 10. The gas output port housing 26 has a hollow interior, and a plurality of gas separators 29 are installed in parallel to partition the interior of the gas output port housing 26 between the inhaling holes 28 and the gas output hole 27. The gas separator 29 has a plurality of holes so that gas may be uniformly inhaled through the plurality of inhaling holes 28. The gas output port 25 may be modified to have two or more gas output holes in parallel, similar to the aforementioned gas input port 20' of FIGS. 9 and 10.

Figure 13:
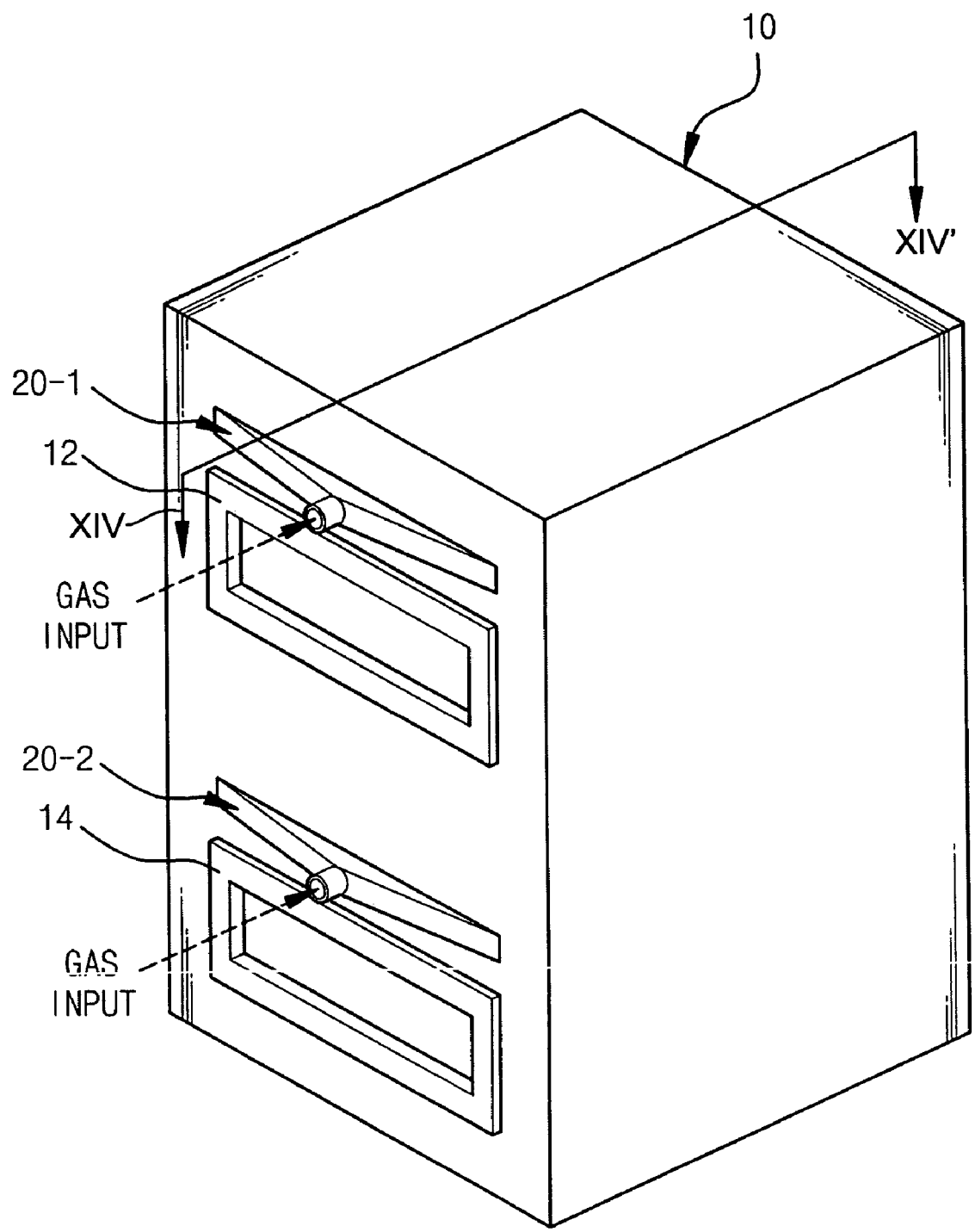
FIGS. 13 and 14 are a perspective view and a sectional view, respectively, showing that a gas input port is configured in a dual manner in upper and lower positions on a front surface of a chamber housing.
Figure 14:
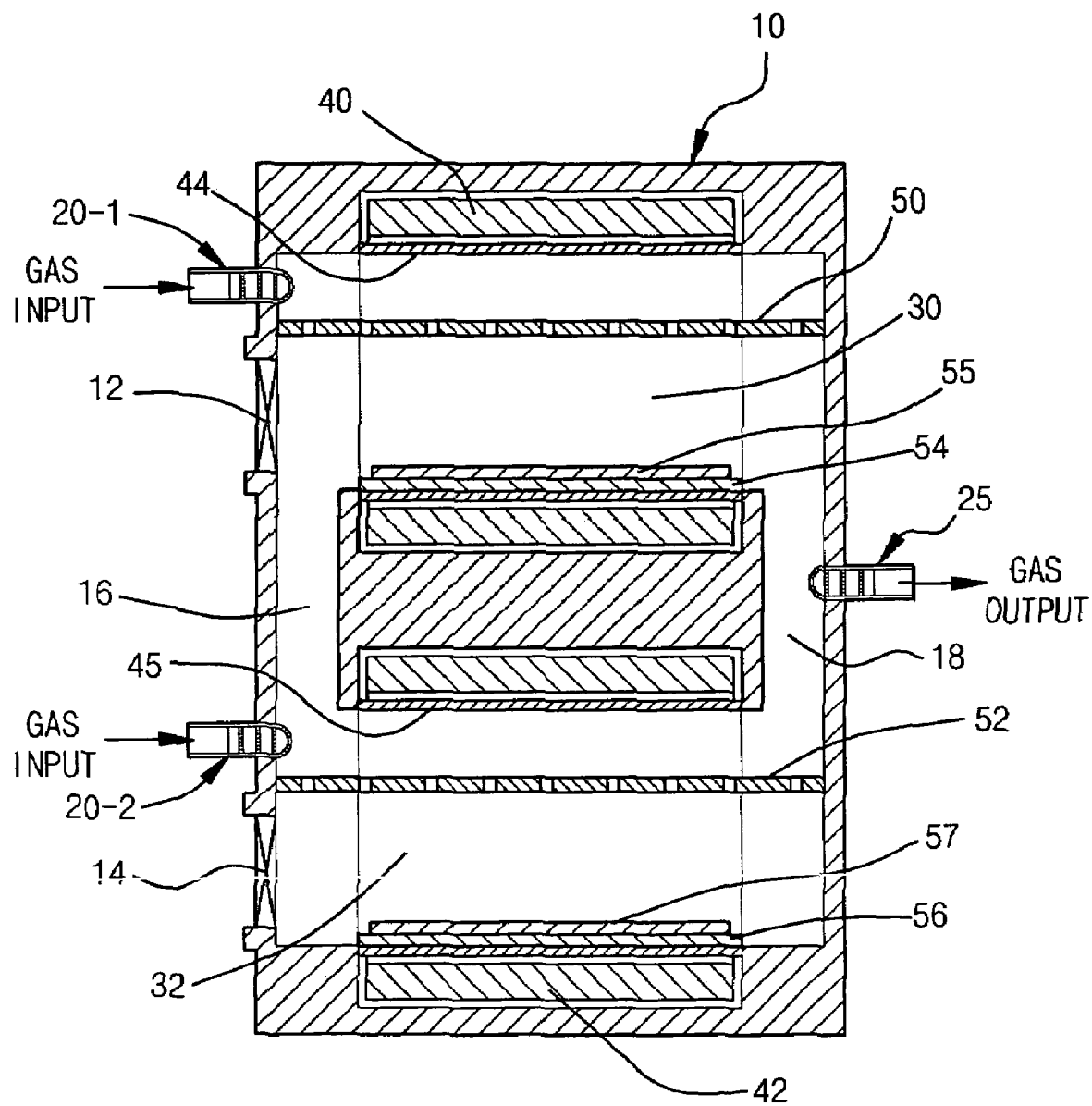

A plurality of such gas input ports 20 and gas output ports 25 may be suitably arranged in the chamber housing 10. For example, as shown in FIGS. 13 and 14, two gas input ports 20-1 and 20-2 may be installed in parallel in the front side of the chamber housing 10. The upper gas input port 20-1 is positioned above the upper baffle plate 50, and the lower gas input port 20-2 is positioned above the lower baffle plate 52. In addition, the gas output port 25 is positioned in a central region of the rear side of the chamber housing 10, similar to the above embodiment.

Figure 15:
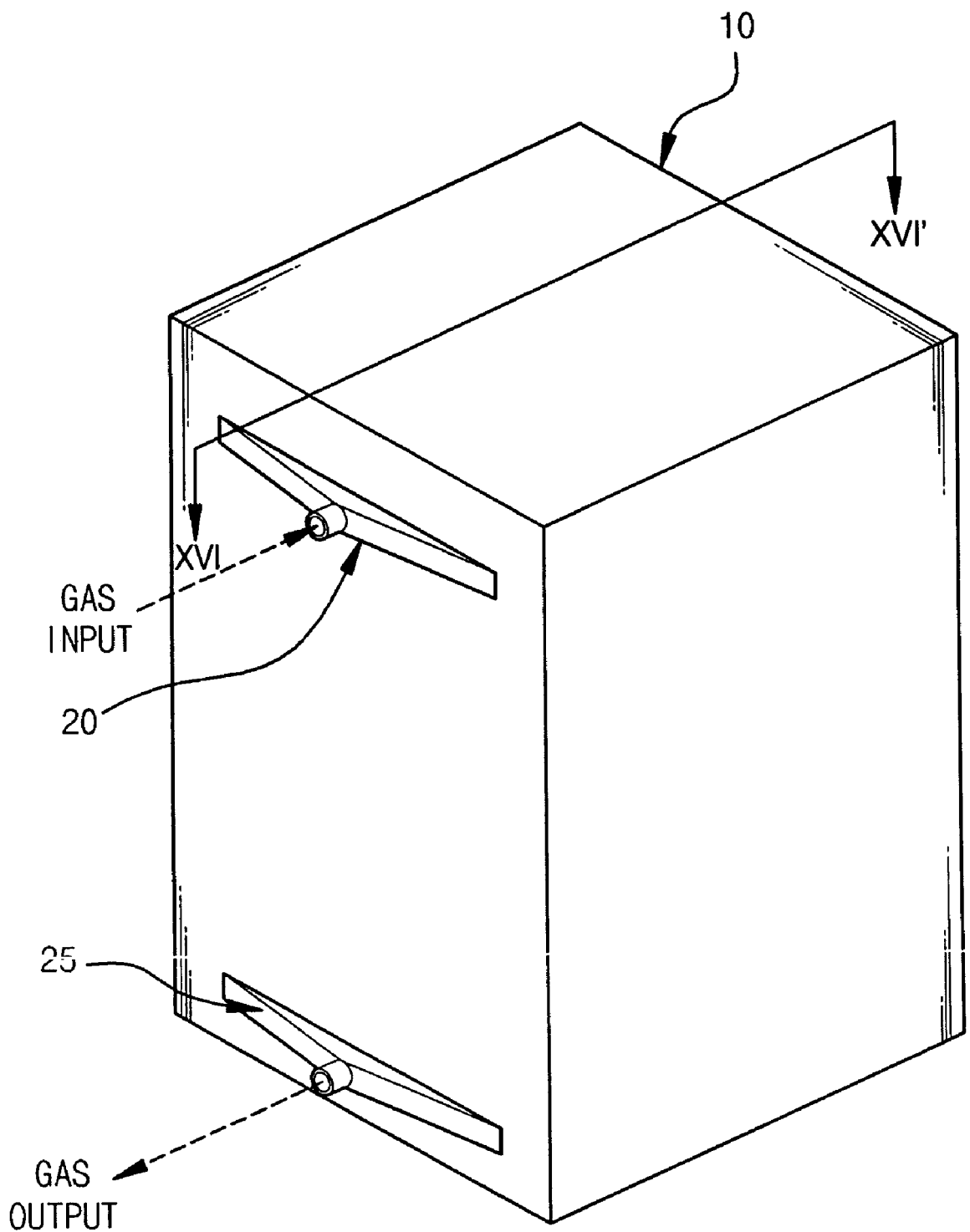
FIGS. 15 and 16 are a perspective view and a sectional view, respectively, showing that a gas input port is provided at an upper position and a gas output port is provided at a lower position on a rear surface of the chamber housing.
Figure 16:
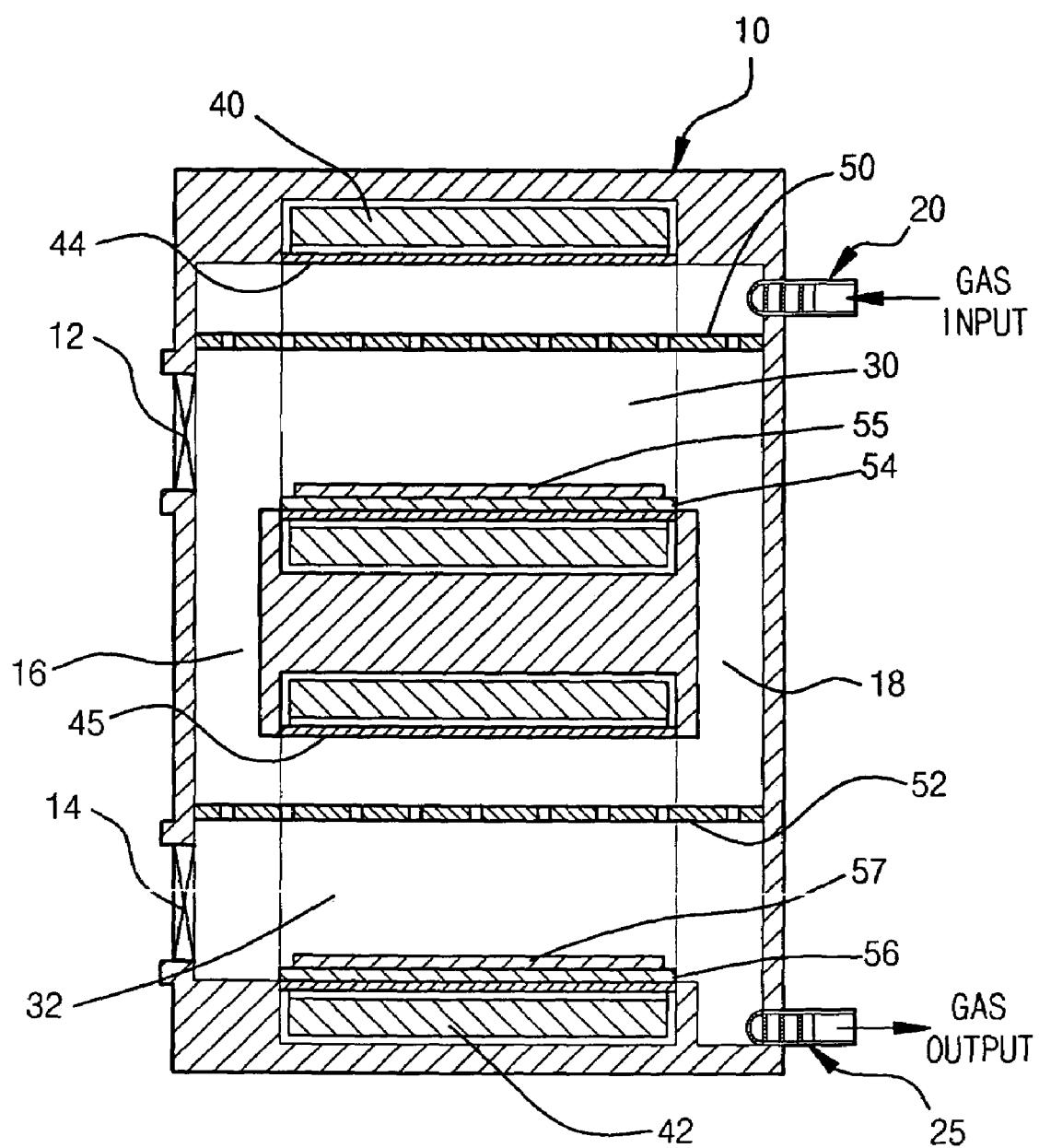

The gas input port 20 and the gas output port 25 may be installed in the rear side of the chamber housing 10. As shown in FIGS. 15 and 16, the gas input port 20 is installed in an upper portion of the rear side of the chamber housing 10, and the gas output port 25 is installed in a lower portion of the rear side of the chamber housing 10. The gas input port 20 is positioned above the upper baffle plate 50, and the gas output port 25 is positioned below the lower susceptor 56.

Figure 17:
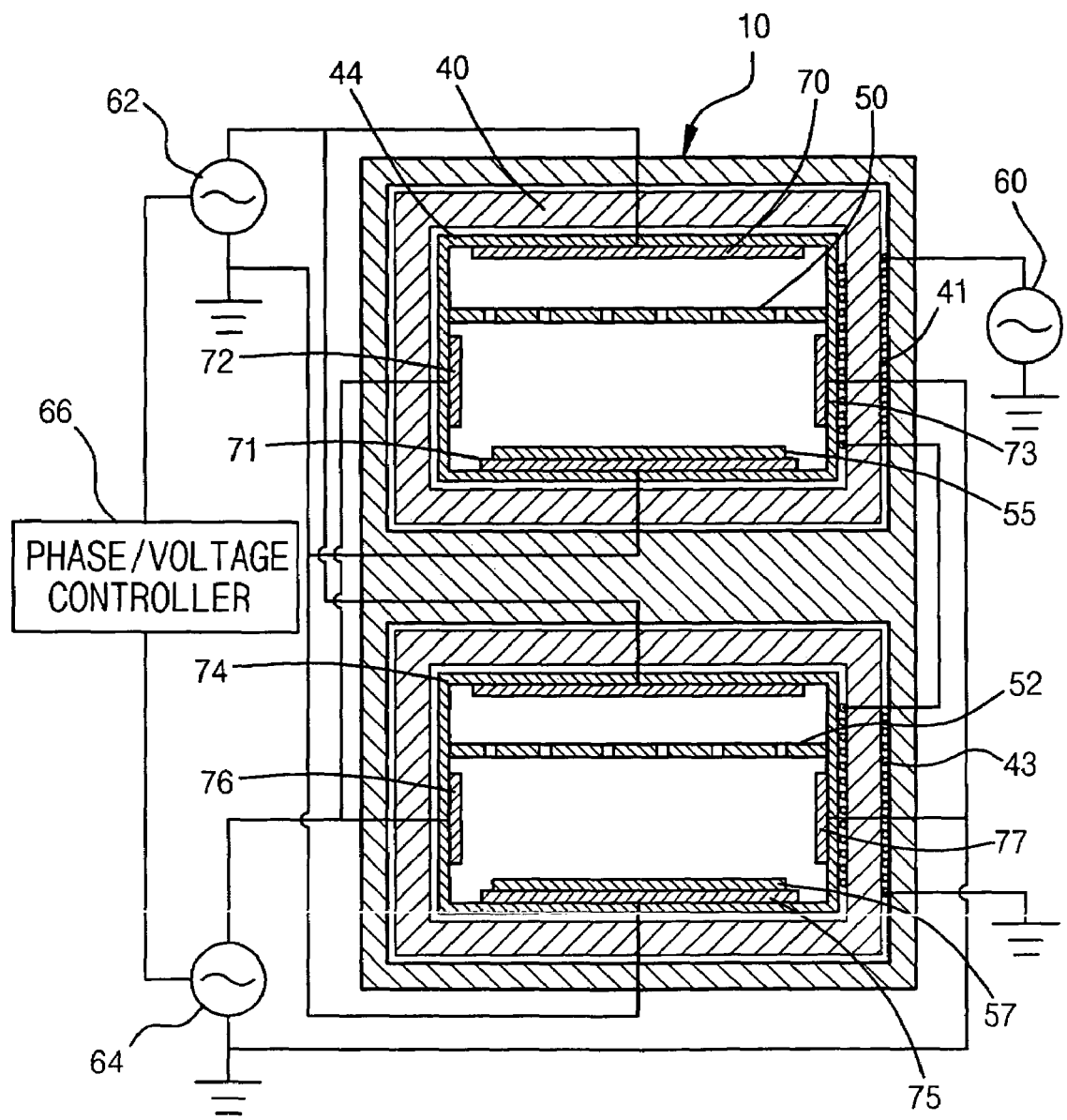
FIG. 17 is a sectional view showing that planar electrode pairs are mounted on upper/lower surfaces and on right/left surfaces of upper and lower vacuum chambers.

FIG. 17 is a sectional view showing that, as an example, planar electrode pairs are installed on upper and lower sides and on right and left sides of the vacuum chamber, as an example.

Referring to FIG. 17, the plasma reaction chamber of the present invention includes two planar electrode pairs 70 and 71, 72 and 73, 74 and 75, 76 and 77 in the upper and lower vacuum chambers 30 and 32, respectively. The first planar electrode pairs 70 and 71, 74 and 75 are installed on the upper and lower portion, respectively, of the inner wall of the upper and lower vacuum chambers 30 and 32, respectively, and the second planar electrode pairs 72 and 73, 76 and 77 are installed in sidewalls of the upper and lower vacuum chambers 30 and 32, respectively. Thus, the first and second planar electrode pairs 70 and 71, 72 and 73, 74 and 75, 76 and 77 are positioned so as to be in a perpendicular relationship with each other. The lower planar electrodes 71 and 75 of the first planar electrode pairs may be configured with the use of susceptors.

The first planar electrode pairs 70 and 71, 74 and 75 installed in the upper and lower vacuum chambers 30 and 32, respectively, are connected in parallel with a first power source 62, while the second planar electrode pairs 72 and 73, 76 and 77 are connected in parallel with a second power source 64. The first power source 62 supplies power of a first frequency to the first planar electrode pairs 70 and 71, 74 and 75, while the second power source 64 supplies power of a second frequency to the second planar electrode pairs 72 and 73, 76 and 77.

The first and second power sources 62 and 64, respectively, are connected to a phase/voltage controller 66 so that phase and/or voltage levels of the first and second frequencies, respectively, may be adjusted. The phase/voltage controller 66 adjusts an incident angle of plasma ion particles generated in the upper and lower vacuum chambers 30 and 32 toward the substrates to be treated by control of the phase and/or voltage levels of the first and second frequencies.

The plasma reaction chamber of the present invention as mentioned above is utilized to treat the substrates 55 and 57, which may be wafer substrates for use in the manufacture of a semiconductor circuit or glass substrates for use in the manufacture of a liquid crystal device. Plasma treatment involves treatment of a wafer substrate for use in manufacture of a semiconductor circuit or treatment of a glass substrate for use in manufacture of a liquid crystal device, and such treatment may be etching or chemical vapor deposition.

Figure 18:
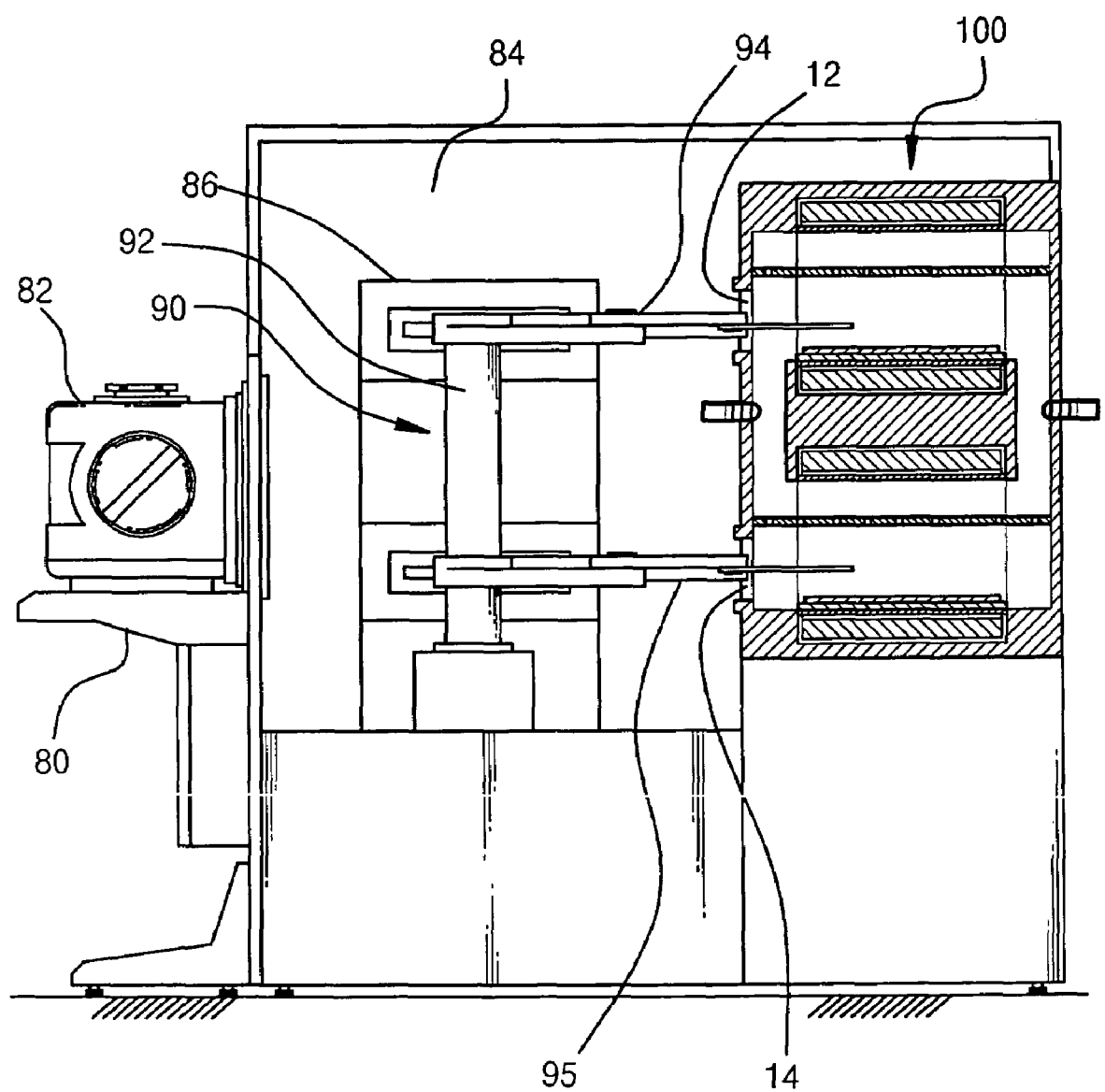
FIG. 18 shows an example of a substrate treatment system adopting the plasma reaction chamber according to the present invention.

Subsequently, a substrate treatment system using the plasma reaction chamber according to the present invention is described. FIG. 18 shows an example of a substrate treatment system adopting the plasma reaction chamber of the present invention, and FIG. 19 is a planar view of a substrate treatment system in which the plasma reaction chambers are arranged in parallel.

Referring to FIG. 18, the substrate treatment system includes a transfer chamber 84 with a transfer robot 90 for carrying a substrate. The transfer chamber 84 is connected to at least one load port 80 for loading a cassette 82 on which a substrate to be treated is loaded, and is connected to a cooling stage 86 for cooling the substrate. In addition, the plasma reaction chamber 100 is connected to the transfer chamber 84. The plasma reaction chamber 100 is already described in detail, and so it is not described again here.

The plasma reaction chamber 100 is configured so that two vacuum chambers are vertically laminated, and two slit valves 12 and 14 are formed facing toward the transfer chamber 84. The transfer robot 90, provided in the transfer chamber 84, has robot arms 94 and 95 in dual (upper and lower) structure for loading or unloading a substrate to be treated through the slit valves 12 and 14, respectively.

Figure 19:
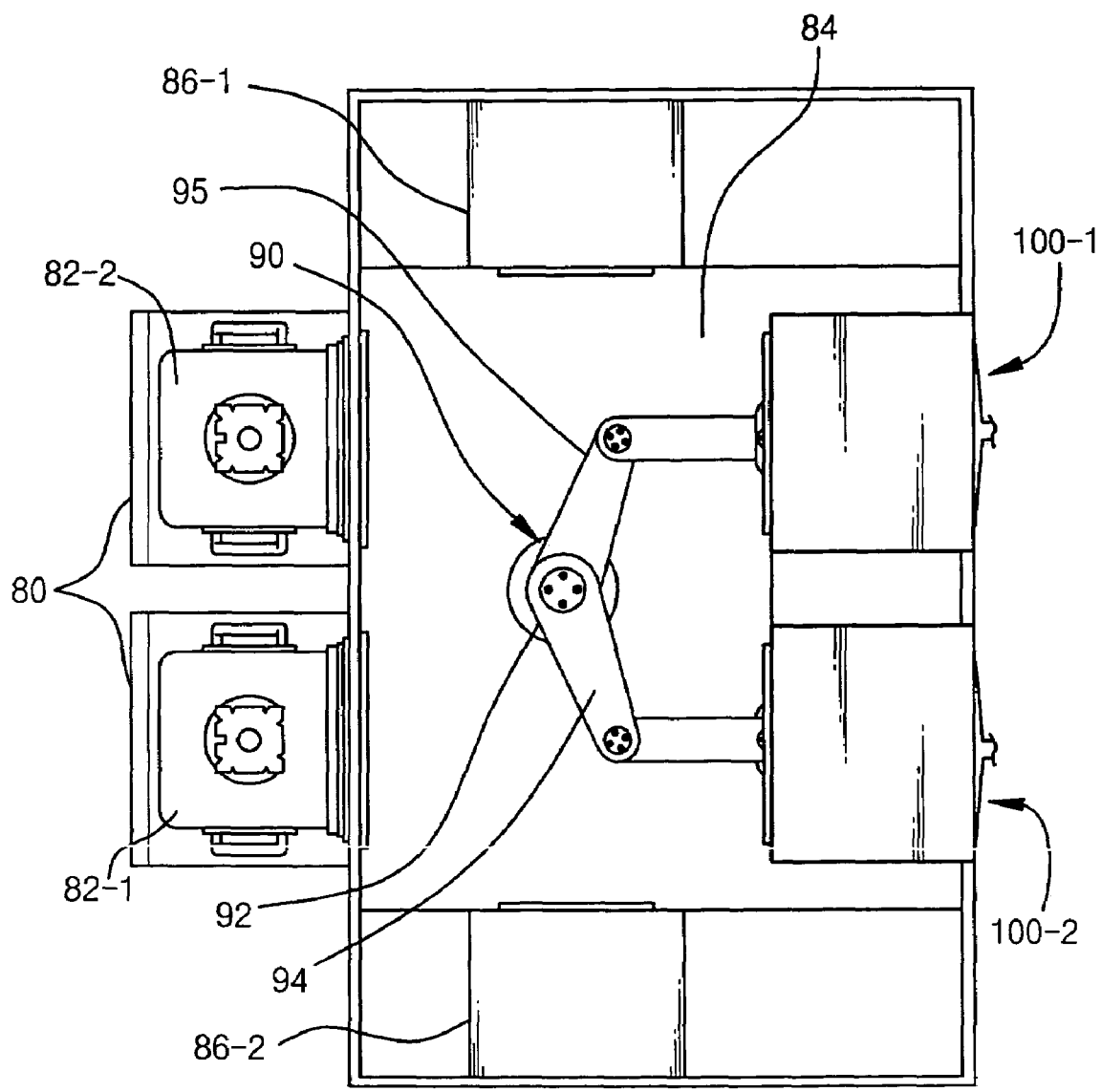
FIG. 19 is a planar view of a substrate treatment system in which the plasma reaction chambers are arranged in parallel.

FIG. 19 shows an example in which two plasma reaction chambers 100-1 and 100-2 are arranged horizontally and in parallel. Each plasma reaction chamber 100-1 or 100-2 is configured so that two vacuum chambers are vertically laminated. Two-stage cooling stages 86-1 and 86-2 are respectively connected to both sides of the transfer chamber 84. Thus, it is possible to treat four substrates at the same time to the maximum extent.

The configuration and operation of the plasma reaction chamber with a built-in magnetic core according to the preferred embodiment of the invention is explained in the above description and is depicted in the drawings. However, the description is provided by way of illustration, and it is to be understood by those skilled in the art that various changes and modifications are possible within the scope of the invention.

As described above, the plasma reaction chamber of the present invention is configured so that at least two vacuum chambers are integrated for multiple arrangement, and common parts are used in common so as to treat at least two substrates in parallel at the same time, thereby improving productivity per unit area and making it possible to construct a production facility at low cost and high efficiency.

Although preferred embodiments of the present invention have been described, it will be understood by those skilled in the art that the present invention should not be limited to the described preferred embodiments. Rather, various changes and modifications may be made within the spirit and scope of the present invention, as defined by the following claims.

What is claimed is:

1. A plasma reaction chamber, comprising:
    a chamber housing having at least two vacuum chambers and at least two inner connection passages for connecting said at least two vacuum chambers, such that the at least two vacuum chambers comprise:
        a first planar electrode pair installed on upper and lower surfaces of the at least two vacuum chambers, and
        a second planar electrode pair installed on both sidewalls in each of the at least two vacuum chambers;
    at least one magnetic core installed in said chamber housing for transferring induced electromotive force to a continuous discharge path formed by two of said at least two vacuum chambers and two of said at least two inner connection passages, said at least one magnetic core having coils connected to a power source and supplying electromotive force for plasma excitation to the continuous discharge path;
    a gas input port installed in said chamber housing for inputting gas into said at least two vacuum chambers and a gas output port installed in said chamber housing for outputting gas from said at least two vacuum chambers; and
    a dielectric plate installed so as to cover a surface of said at least one magnetic core and oriented toward the continuous discharge path.

2. The plasma reaction chamber according to claim 1, wherein said at least one magnetic core has a ring shape and is mounted on an inner surface of said at least two vacuum chambers.

3. The plasma reaction chamber according to claim 1, wherein said at least one magnetic core has a ring shape and is mounted on an inner side of said at least two inner connection passages.

4. The plasma reaction chamber according to claim 1, wherein said at least two vacuum chambers are vertically laminated.

5. The plasma reaction chamber according to claim 1, wherein said at least two vacuum chambers are arranged horizontally and in parallel.

6. The plasma reaction chamber according to claim 1, wherein said at least two vacuum chambers include a susceptor installed in a lower portion of said at least two vacuum chambers for holding a substrate to be treated, and a baffle plate installed in an upper portion of said at least two vacuum chambers.

7. The plasma reaction chamber according to claim 1, wherein each of said at least two vacuum chambers has a slit valve for loading and unloading a substrate to be treated.

8. The plasma reaction chamber according to claim 1, wherein said coils wound around said at least one magnetic core are connected to the power source by means of one of a series connection, a parallel connection, and a combined series-parallel connection.

9. The plasma reaction chamber according to claim 1, wherein one of at least two gas input ports and at least two gas output ports are provided in said chamber housing so that said chamber housing has one of a multiple gas input and a multiple gas output structure.

10. A substrate treatment system comprising a plasma reaction chamber as recited in claim 1.

11. The plasma reaction chamber according to claim 1, wherein each of said at least two vacuum chambers comprises:
    a first power source for supplying power of a first frequency to said first planar electrode pair;
    a second power source for supplying power of a second frequency to said second planar electrode pair; and
    a phase/voltage controller for adjusting at least one of a phase difference and a voltage level of the first and second frequencies by control of said first and second power sources, respectively.

12. A plasma reaction chamber, comprising:
    a chamber housing having at least two vacuum chambers and at least two inner connection passages for connecting said at least two vacuum chambers;
    at least one magnetic core installed in said chamber housing for transferring induced electromotive force to a continuous discharge path formed by two of said at least two vacuum chambers and two of said at least two inner connection passages, said at least one magnetic core having coils connected to a power source and supplying electromotive force for plasma excitation to the continuous discharge path; and
    a gas input port installed in said chamber housing for inputting gas into said at least two vacuum chambers and a gas output port installed in said chamber housing for outputting gas from said at least two vacuum chambers;
    wherein each of said at least two vacuum chambers comprises:
    a first planar electrode pair installed on upper and lower surfaces of said each of said at least two vacuum chambers and a second planar electrode pair installed on both sidewalls in said each of said at least two vacuum chambers;
    a first power source for supplying power of a first frequency to said first planar electrode pair;
    a second power source for supplying power of a second frequency to said second planar electrode pair; and
    a phase/voltage controller for adjusting at least one of a phase difference and a voltage level of the first and second frequencies by control of said first and second power sources, respectively.

13. A substrate treatment system comprising a plasma reaction chamber as recited in claim 12.

14. A plasma reaction chamber, comprising:
    a chamber housing having at least two vacuum chambers and at least two inner connection passages for connecting said at least two vacuum chambers, such that the at least two vacuum chambers comprise:
        a first planar electrode pair installed on upper and lower surfaces of the at least two vacuum chambers, and
        a second planar electrode pair installed on both sidewalls in each of the at least two vacuum chambers;
    at least one magnetic core installed in said chamber housing for transferring induced electromotive force to a continuous discharge path formed by two of said at least two vacuum chambers and two of said at least two inner connection passages, said at least one magnetic core having coils connected to a power source and supplying electromotive force for plasma excitation to the continuous discharge path; and a gas input port installed in said chamber housing for inputting gas into said at least two vacuum chambers and a gas output port installed in said chamber housing for outputting gas from said at least two vacuum chambers;

wherein said gas input port comprises:

a gas input port housing having a gas input hole leading out of said chamber housing and a plurality of discharge holes leading into said chamber housing; and at least one gas separator installed in said gas input port housing to partition an interior of said gas input port housing between said gas input hole and said discharge holes, said at least one gas separator having a plurality of holes so that gas inputted through said gas input hole is uniformly distributed and then outputted through said discharge holes.

15. The plasma reaction chamber according to claim 14, wherein said gas input port has at least two gas input holes arranged in parallel.

16. A substrate treatment system comprising a plasma reaction chamber as recited in claim 14.

17. The plasma reaction chamber according to claim 14, wherein each of said at least two vacuum chambers comprises:

a first power source for supplying power of a first frequency to said first planar electrode pair;

a second power source for supplying power of a second frequency to said second planar electrode pair; and a phase/voltage controller for adjusting at least one of a phase difference and a voltage level of the first and second frequencies by control of said first and second power sources, respectively.

18. A plasma reaction chamber, comprising:

a chamber housing having at least two vacuum chambers and at least two inner connection passages for connecting said at least two vacuum chambers, such that the at least two vacuum chambers comprise:

a first planar electrode pair installed on upper and lower surfaces of the at least two vacuum chambers, and a second planar electrode pair installed on both sidewalls in each of the at least two vacuum chambers;

at least one magnetic core installed in said chamber housing for transferring induced electromotive force to a continuous discharge path formed by two of said at least two vacuum chambers and two of said at least two inner connection passages, said at least one magnetic core having coils connected to a power source and supplying electromotive force for plasma excitation to the continuous discharge path; and a gas input port installed in said chamber housing for inputting gas into said at least two vacuum chambers and a gas output port installed in said chamber housing for outputting gas from said at least two vacuum chambers;

wherein said gas output port comprises:

a gas output port housing having a plurality of inhaling holes leading into said chamber housing and a gas output hole leading out of said chamber housing; and at least one gas separator installed in said gas output port housing so as to partition an interior of said gas output port housing between said inhaling holes and said gas output hole, said at least one gas separator having a plurality of holes so that the gas inputted through said inhaling holes is uniformly inhaled and then outputted through said gas output hole.

19. The plasma reaction chamber according to claim 18, wherein said gas output port has at least two gas output holes arranged in parallel.

20. A substrate treatment system comprising a plasma reaction chamber as recited in claim 18.

21. The plasma reaction chamber according to claim 18, wherein each of said at least two vacuum chambers comprises:

a first power source for supplying power of a first frequency to said first planar electrode pair;

a second power source for supplying power of a second frequency to said second planar electrode pair; and a phase/voltage controller for adjusting at least one of a phase difference and a voltage level of the first and second frequencies by control of said first and second power sources, respectively.

22. A plasma reaction chamber, comprising:

a chamber housing comprising two vacuum chambers and at least two inner connection passages to connect the two vacuum chambers, such that the two vacuum chambers comprise:

a first planar electrode pair installed on upper and lower surfaces of the two vacuum chambers, and a second planar electrode pair installed on both sidewalls in each of the two vacuum chambers, wherein the second planar electrode pair is perpendicular to the first planar electrode pair;

at least one magnetic core installed in the chamber housing to transfer an induced electromotive force to a continuous discharge path formed by the two vacuum chambers and two of the at least two inner connection passages, such that the at least one magnetic core comprises coils connected to a power source and supplies an electromotive force to perform plasma excitation to the continuous discharge path; and a gas input port installed in said chamber housing to input gas into said at least two vacuum chambers and a gas output port installed in said chamber housing to output gas from said at least two vacuum chambers.

* * * * *